US012782427B2

(12) United States Patent
Hasse et al.

(10) Patent No.: US 12,782,427 B2
(45) Date of Patent: Nov. 3, 2026

(54) TEST STAND FOR CONFRONTING A TEST PIECE WITH A SIMULATED ELECTRICAL FAULT

(71) Applicant: dSPACE GmbH, Paderborn (DE)

(72) Inventors: Dirk Hasse, Paderborn (DE); Jochen Sauer, Paderborn (DE)

(73) Assignee: dSpace GmbH, Paderborn (DE)

( * ) Notice: Subject to any disclaimer, the term of this patent is extended or adjusted under 35 U.S.C. 154(b) by 82 days.

(21) Appl. No.: 18/947,963

(22) Filed: Nov. 14, 2024

(65) Prior Publication Data

US 2026/0133247 A1 May 14, 2026

(30) Foreign Application Priority Data

Nov. 14, 2023 (DE) ..................... 10 2023 131 699.0
Jul. 9, 2024 (EP) .................................... 24187394

(51) Int. Cl.
*G01R 31/28* (2006.01)
*G01R 31/12* (2020.01)

(52) U.S. Cl.
CPC ..... *G01R 31/2879* (2013.01); *G01R 31/1227* (2013.01); *G01R 31/2837* (2013.01); *G01R 31/2841* (2013.01); *G01R 31/2868* (2013.01)

(58) Field of Classification Search
CPC ............ G01R 31/2879; G01R 31/1227; G01R 31/2837; G01R 31/2841; G01R 31/2868; G01R 31/282; G06F 11/261
See application file for complete search history.

(56) References Cited

U.S. PATENT DOCUMENTS 6,070,261 A * 5/2000 Tamarapalli ... G01R 31/318342 714/733
2002/0010877 A1* 1/2002 Ernst ...................... G11C 29/48 714/724
2006/0036917 A1* 2/2006 Boldt ..................... G11C 29/26 714/718
2008/0319728 A1* 12/2008 Bruski ............... G05B 23/0256 703/13
2021/0334436 A1* 10/2021 Bobe ....................... G06F 30/20
2023/0333585 A1 10/2023 Galin et al.

FOREIGN PATENT DOCUMENTS

CN 105223941 A 1/2016
CN 110377004 A 10/2019
CN 111399480 A 7/2020

* cited by examiner

*Primary Examiner* — Alvaro E Fortich
(74) *Attorney, Agent, or Firm* — Muncy, Geissler, Olds & Lowe, P.C.

(57) ABSTRACT

A test stand for confronting a test piece with a simulated electrical fault. The test stand includes a central fault control unit for orchestrating the simulated electrical fault, and at least one local node configured as a failure insertion unit (FIU), with a switch arrangement for falsifying selected electrical currents in the test stand. The fault control unit is configured to create an abstract fault description, which specifies at least one electrical fault to be applied to an electrical line, and to transmit it to the local node. The local node is configured to derive from the abstract fault description an activation rule for the switch arrangement that is suitable for applying the electrical fault to the electrical line, and to apply the electrical fault to the electrical line by activating the switch arrangement according to the activation rule.

11 Claims, 6 Drawing Sheets

TEST STAND FOR CONFRONTING A TEST PIECE WITH A SIMULATED ELECTRICAL FAULT

This nonprovisional application claims priority under 35 U.S.C. § 119(a) to German Patent Application No. 10 2023 131 699.0, which was filed on Nov. 14, 2023, and European Patent Application No. 24187394.2, which was filed on Jul. 9, 2024, which are herein incorporated by reference.

The invention relates to the simulation of electrical faults for control systems.

Control systems for controlling mechatronic systems, often installed in the form of compact, closed electronic control units (ECUs), are checked for correct functioning prior to use in mass production. In particular for safety-critical control systems, which may entail serious consequences when they malfunction in the field, for this purpose it is common to validate the control system in a test stand, which provides the control system with a realistic virtual working environment in which the control system is confrontable with different situations in a targeted and reproducible manner in order to test its response to these situations. These types of test stands are known in the field as hardware-in-the-loop test stands, or HILs for short.

The tests to be carried out may include testing of the response of the control system to electrical faults in its working environment. An electrical fault may basically be understood to mean any deviation of the electrical current flow in the working environment from the intended conduction of the electrical current. Examples include interruptions caused by cable breakage, short circuits, or leakage currents due to cable wear. Test stands are available on the market which for this purpose are configured for the simulation of electrical faults. Such test stands typically include specialized electrical lines for conducting or transmitting simulated faulty currents, and switches for establishing or separating electrical connections to/from the stated lines.

In the prior art, these switches are typically situated on modular failure insertion units (FIUs) and distributed over the test stand, but are activated by a central fault control unit of the test stand. Such a design is disadvantageous in two respects. First, the complexity of the fault management to be performed by the fault control unit increases with each FIU that is added to the test stand. The test stand is therefore not easily scalable. Second, the design of the FIUs must be known to the fault control unit to allow correct activation of the switches installed thereon. The integration of specialized FIUs that differ from a standard design, for example that are adapted to a specific customer wish and/or supplied by a third-party provider, is therefore difficult.

In light of this background, the object of the invention is to simplify the control of local failure insertion units by a central fault control unit.

The object is achieved according to the invention by a test stand for confronting a test piece, in particular a control system, with a simulated electrical fault. The test stand includes a central fault control unit for orchestrating the simulated electrical faults, and at least one first local node for carrying out a fault simulation prompted by the fault control unit. The local node is an FIU, and its execution of the fault simulation takes place by activating a first arrangement of switches for falsifying selected electrical currents in the test stand.

The fault control unit is configured to create a first abstract fault description that specifies at least one first electrical fault for application to a first electrical line, and to transmit it to the first local node. The first local node is configured to derive from the first abstract fault description a first activation rule for the first switch arrangement that is suitable for applying the first electrical fault to the first electrical line, and to apply the first electrical fault to the first electrical line by activating the first switch arrangement according to the first activation rule.

An abstract fault description is understood to mean a specification for an electrical fault which, although it stipulates a specific electrical fault to be applied to a particular electrical line, does not designate specific switches from the first switch arrangement or some other switch arrangement that are to be activated by a local node for applying the fault, nor does it contain specifications for how the switches are to be activated. According to the invention, the local FIUs thus obtain only a basic description of an electrical fault that is to be applied to one or more electrical lines, and are configured to independently derive from the basic description an activation of the switches that implements the electrical fault according to the description.

The invention thus improves the scalability of the test stand by enabling the FIUs to independently manage the application of simulated faults. In addition, the invention facilitates the development of new FIUs, in particular also as single parts or custom-made products. A newly developed FIU only needs to understand a predefined protocol that is used by the central fault control unit. Necessary adaptations to the central fault control unit for controlling the newly developed FIU are greatly reduced by use of the invention, or in some advantageous embodiments of the invention are not necessary at all.

In the prior art, it is basically known to delegate the intelligence for activating switches by a central control entity to local nodes. As an example, the patent application US 2023 033 3585 A1 describes a household power network having decentralized local switch units, which by use of locally stored control software can connect electrical consumers to a photovoltaic system or disconnect them from a photovoltaic system.

The activation of the switches is based on evaluating the power consumed by a consumer and prioritizing the consumer, and limiting the switching operations to simple connections or disconnections of electrical connections of consumers to a power source. Independent derivations of complex switching operations to flexibly achieve different current flows are not provided in the teaching of the cited patent application.

The first local node is advantageously designed as a modular part, in particular as a plug-in circuit board, that is easily and nondestructively removable from the test stand.

For orchestrating the electrical faults, the central fault control unit is advantageously configured to read out a cabling description that is stored on a memory medium of the test stand, in which an overview of electrical lines of the test stand, including the first electrical line, and in particular also further information needed to orchestrate the electrical faults are stored.

The fault control unit is advantageously configured to specify the first electrical fault in the first abstract fault description as a cable breakage, a short circuit, a leakage current to ground, a leakage current between the first electrical line and a second electrical line, a loose contact, or a bounce pattern (an undesirable electrical contact with a time-varying resistance, for example due to an oscillating cable end or vibration). A specification of an electrical fault is understood to mean a number of fundamental characteristics of a certain type of fault, which the fault control unit transmits to the first local node in the first abstract fault description. As an example, a "leakage current to ground" may be specified in that a portion of the current intensity conducted across the first electrical line branches off from the first electrical line and is conducted to a specialized conductor rail that is provided to remove simulated leakage currents. After receiving this specification, the first local node or an FIU according to the invention would independently derive a switch configuration that establishes a connection, conducted across an electrical resistor, from the first electrical line to the specialized conductor rail. Of course, the fundamental characteristics in the first fault description may be supplemented with specific specifications. Examples of a specific specification may include a current intensity or an electrical resistance of a leakage current. Based on the specification, the first local node or an FIU according to the invention may conduct the simulated leakage current across a controllable resistance, and set the controllable resistance so that the current intensity or the electrical resistance of the simulated leakage current corresponds to the specification.

In principle, the first electrical line may be configured as a power line, as a data line, or as a combination of both (Power over Coax, Power over Ethernet, etc.), and is preferably in a direct electrical connection with the test piece, so that the application of the first electrical fault to the first electrical line has a direct effect on the test piece. In other words, the first electrical line is advantageously configured to conduct an electrical current that transfers energy and/or information from the test piece to the test stand, or that transfers the energy and/or information in the reverse direction, from the test stand to the test piece.

The test stand advantageously includes an arrangement of fault conductor rails, i.e., electrical lines that are laid in the test stand specifically for transferring electrical currents for the simulation of electrical faults, and the first local node, by activation of the first switch arrangement, is configured to establish an electrical contact of the first electrical line with a fault conductor rail. The arrangement of fault conductor rails particularly advantageously includes fault conductor rails running in parallel, and that differ in their electrical properties and are optimized for simulating different types of electrical faults. In particular, one fault conductor rail may be optimized for conducting high current intensities, and one fault conductor rail may be optimized for conducting electrical signals for information transfer, i.e., as a data line.

In one expansion level of the invention, the first local node is configured to check the first fault description for executability, and to provide feedback of determined non-executability of the first fault description. The feedback may take place at the central fault control unit or at some other entity of the test stand, for example at a graphical user interface (GUI) of an operational component of the test stand. The checking for executability includes a check for whether technical components of the first local node, in particular switches from the first switch arrangement, meet the specifications necessary for applying the first electrical fault according to the first fault description. The check may include a comparison of a time setting in the first fault description to a switching time of at least one switch from the first switch arrangement in order to check whether the time setting can be fulfilled. The check may include a comparison of a current-carrying capacity, in particular of at least one switch from the first switch arrangement, to a current intensity specification contained in the first fault description in order to avoid damage to components of the first local node. The check may include a comparison of a breakdown voltage, in particular of at least one switch from the first switch arrangement, to a voltage specification contained in the first fault description.

The check may include a check for compatibility of the first activation rule with another activation rule that is already stored on the first local node, wherein compatibility is not present in particular when the first electrical fault and the electrical fault applied by the other activation rule cannot be carried out simultaneously, for example because of double occupancy of a switch.

The FIUs of the test stand as a whole advantageously include mechanical switches and semiconductor switches. Mechanical switches generally have a higher current-carrying capacity, and in the open state have a better insulating effect. Therefore, they are particularly suited for transferring high current intensities or for simulating a cable breakage under high voltage. Semiconductor switches are controllable and have fairly short switching times. Therefore, they are particularly suited for simulating leakage currents or bounce patterns, and for rapid switching operations. The individual FIUs, such as the first local node, particularly advantageously include semiconductor switches as well as mechanical switches to allow local simulation in each case of many different types of electrical faults.

The first local node is advantageously configured to determine a first time period that is necessary for applying the first electrical fault and transmit it to the fault control unit, so that the fault control unit can take the first time period into account in orchestrating the simulated electrical faults. The determination of the first time period may take place in particular based on switching times of switches that are addressed in the first activation rule.

The fault control unit is particularly advantageously configured to synchronize, using the first time period, the application of the first electrical fault with the application of at least a second electrical fault via a second local node. The first and second electrical faults may be correlated only with respect to time, and otherwise may be independent of one another. However, it is also possible for the synchronization of the first and second electrical faults to take place for the purpose of applying an electrical macro fault, for which the first local node as well as the second local node, possibly also even further local nodes, are necessary. As an example, the electrical macro fault may be a leakage current from the first electrical line to a second electrical line, for the simulation of which it is necessary for the first electrical line to be connected to a fault conductor rail via the first local node, and for the same fault conductor rail to be connected to the second electrical line via the second electrical node.

In this form of the invention, the fault control unit is configured to create a second abstract fault description that specifies at least a second electrical line and a second electrical fault that is to be applied to the second electrical line, and to transmit it to the second local node. The second local node includes a second switch arrangement, and is configured, based on the second abstract fault description, to derive a second activation rule for the second switch arrangement that is suitable for applying the second electrical fault to the second electrical line, to determine a second time period that is required for applying the second electrical fault, and to transmit the second time period to the fault control unit, and to apply the second electrical fault to the second electrical line by activating the second switch arrangement according to the second activation rule. The fault control unit is configured to synchronize the application of the first electrical fault with the application of the second electrical fault, taking the first time period and the second time period into account.

Depending on the embodiment of the invention, the second abstract fault description may be different from or the same as the first abstract fault description. In one possible embodiment of the invention, the fault control unit creates an individual fault description for each local node. In this embodiment, however, a portion of the fault planning remains with the fault control unit, which must at least derive which local nodes are involved, and how they are involved, with the application of a given fault. The fault planning is advantageously completely delegated to the local nodes.

For this purpose, the fault control unit may be designed to send a fault description for describing a fault, in the form of a broadcast, to all local nodes installed in the test stand, in particular regardless of whether only one local node is involved with the fault, or whether this is a macro fault for whose application two or more local nodes are involved. Thus, in this embodiment the first local node, the second local node, and any further local node installed in the test stand receive a copy of the same fault description. Each local node, in particular the first local node and the second local node, is/are designed to analyze the fault description, and based on the analysis to recognize whether the local node itself is involved with the application of the fault, and if this is not the case, to ignore the fault description.

For applying a macro fault, this embodiment naturally requires a certain agreement between the local nodes involved with the application of the macro fault. For example, returning to the example, just described, of a leakage current between the first and the second electrical lines, if a resistance of the leakage current is specified in the associated fault description, by use of a convention the respective involvement of the first local node and the second local node in applying the resistance must be established.

Different approaches are conceivable for this purpose. For example, in such a case both local nodes may be designed to respectively apply one-half of the specified resistance. Alternatively, based on a predefined hierarchy of the local nodes it may be established which local node is responsible for applying the resistance. As a further alternative, the first and second local nodes may be designed to exchange messages with one another to establish whether the first or the second local node is responsible for applying the resistance. A further option is to avoid such unclear task distributions from the outset by using an unambiguous system architecture. In the stated example, this may mean, for example, that only the first of the local nodes is designed at all for applying resistances to the fault conductor rail, and the second local node is designed to ignore such specifications of resistances, or that for controlling the electrical resistance of the fault conductor rails, a third local node, dedicated for this purpose, is situated on the fault conductor rail.

The following descriptions of the drawings explain one exemplary embodiment of the invention. In the figures.

Figure 1:
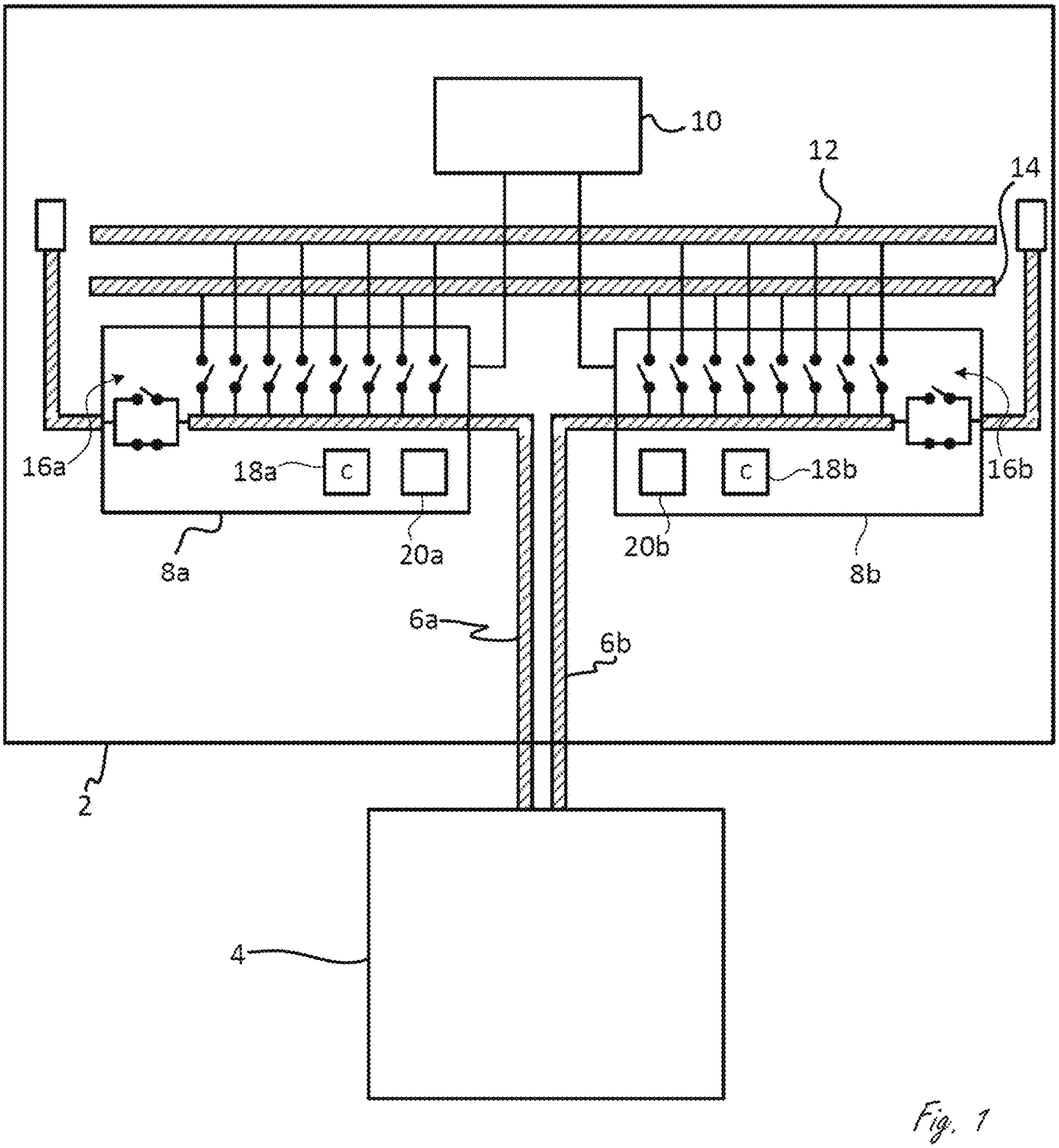
FIG. 1 shows a schematic illustration of a test stand according to the invention, including a first local node and a second local node for the fault simulation.

The illustration in FIG. 1 shows a test stand 2 that is connected to a test piece by way of example via two electrical lines 6, a first electrical line 6*a* and a second electrical line 6*b*. The first electrical line 6*a* and the second electrical line 6*b* represent electrical lines by means of which the test piece 4 during normal operation would be integrated into a working environment in order to exchange electrical energy and/or data with the working environment. The test stand 2 is configured to activate the current flow on the electrical lines 6 in such a way that normal operation in the working environment is credibly and realistically simulated for the test piece 4. For this purpose, the test stand 2 includes a central processor, which is also configured as a central fault control unit 10 and also executes a simulation model, and which based on the simulation model generates synthetic sensor data and supplies them to the test piece 4, reads in control data from the test piece 4 and takes them into account in the simulation model, induces electrical currents on the electrical lines 6, or responds to currents on the electrical lines 6 that are induced by the test piece. The test stand 2 thus provides the test piece with a virtual working environment, within which the test piece is safely and reproducibly testable for correct functioning. The test piece 4 may in particular be an electronic control unit, for example for controlling a motor, a battery, an inverter, or any given electrical system.

In its function as a central fault control unit 10, the central processor is configured to apply electrical faults to the electrical lines 6, using local nodes 8 set up for this purpose, in order to test a requested response thereto by the test piece 4. For this purpose, the test stand 2 includes a first local node 8*a* and a second local node 8*b*. Both local nodes 8 are configured as modular, exchangeable FIUs. The test stand 2 also includes an arrangement of fault conductor rails, which in the drawing are represented by a first fault conductor rail 12 and a second fault conductor rail 14 extending in parallel to the first fault conductor rail 12. The arrangement of fault conductor rails has a bus-like configuration in the test stand 2, so that by interconnecting fault conductor rails with one another and/or by using FIUs 8 at different locations in the test stand 2, each FIU 8 of the test stand 2 is connectable to the arrangement of fault conductor rails, and in this way a plurality of current paths for simulating electrical faults may be achieved. The fault conductor rails extending in parallel may be different with regard to their electrical properties. As an example, the first fault conductor rail 12 is optimized for conducting high current intensities, and the second fault conductor rail 14 is optimized for transferring signals.

The first local node 8*a* includes a first switch arrangement 16*a*, on the basis of which an electrical contact between the first electrical line 6*a* and the first fault conductor rail 12 or the second fault conductor rail 14 is establishable. The first switch arrangement 16*a* also includes switches for interrupting the first electrical line 6*a* and for increasing the electrical resistance of the first electrical line 6*a*. The first switch arrangement 16*a* includes a plurality of switches with different technical specifications and performance indicators. In particular, the first switch arrangement also includes mechanical switches that are designed for conducting high current intensities, as well as semiconductor switches that are quickly switchable and controllable with precise timing.

The illustration of the first switch arrangement 16*a* is greatly simplified. For applying an electrical fault, a commercially available FIU includes a complex network of switches whose activation is much less trivial than appears in the illustration.

The first local node 8*a* includes a first local memory 20*a* and a first local processor unit 18*a* for activating the individual switches in the first switch arrangement 16*a*. All information required by the first local processor unit 18*a* for activating the first switch arrangement 16*a* according to the invention is stored on the first local memory 20*a*, either natively, or stored by the fault control unit 10 as described below. The natively stored information includes at least one listing of the switches in the first switch arrangement 16*a* as well as parameters of the individual listed switches. Possible examples of parameters are limits of the transferable current intensity, switching times, control performance (rise times, overshoot amplitudes, settling times, etc.), control accuracies, and breakdown voltages. The first local processor unit 18*a* is configured to read out and evaluate the information stored on the first local memory 20*a*.

The second local node 8*b* in its basic functionality is configured the same way as the first local node 8*a*, and is analogously arranged for applying an electrical fault to the second electrical line 6*b*. The second local node includes a second switch arrangement 16*b*, a second local processor unit 18*b*, and a second local memory 20*b*, which are configured analogously to their functional counterparts on the first local node 8*a* and interconnected with same. The second switch arrangement 16*b* may differ from the first switch arrangement 16*a* in some details, in particular with regard to the number of switches, the technical specifications, and performance indicators of the individual switches as well as the circuit topology.

Figure 2:
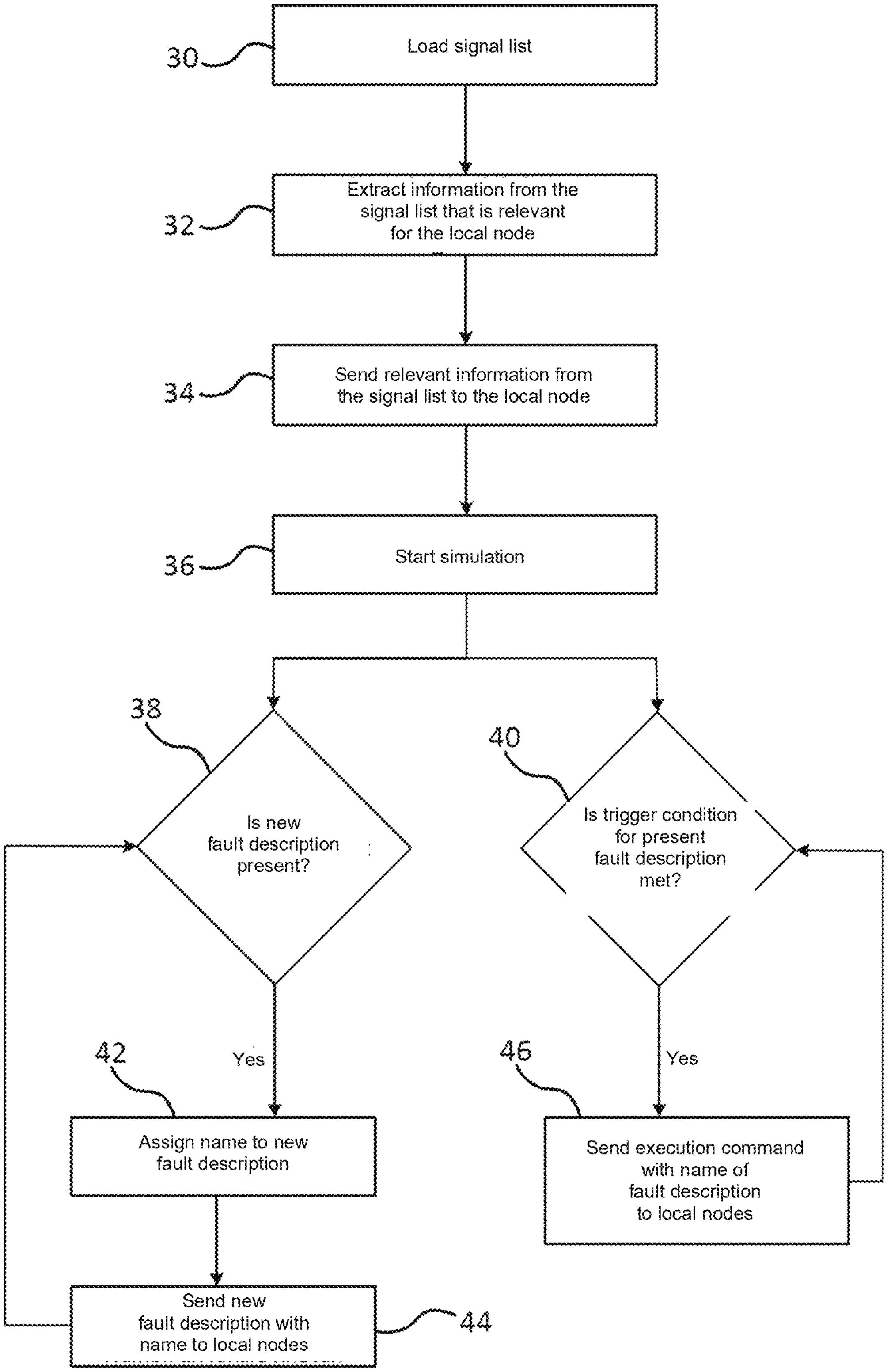
FIG. 2 shows a flow chart of a simulation of an electrical fault, carried out using the test stand, from the perspective of the central fault control unit.

The illustration in FIG. 2 depicts, in the form of a flow chart, an example of a simulation run carried out by the test stand 2 from the perspective of the central fault control unit 10. The simulation run includes simulations of electrical faults which the fault control unit 10 orchestrates in interaction with at least one local node 8. The stated local node may be the first local node 8*a*, the second local node 8*b*, or any other given further local node (not illustrated). When the fault control unit 10 makes use of more than one local node 8 in orchestrating the electrical faults, the process illustrated in FIG. 2 is carried out in parallel for each of the local nodes 8 used in the simulation run.

A signal list is loaded onto the fault control unit 10 and evaluated by same in a first step 30. The signal list is a cabling description in which the first electrical line 6*a*, the second electrical line 6*b*, and a plurality of further electrical lines of the test stand 2 are listed. The signal list generally includes the electrical lines and components of the test stand 2 that are specifically relevant for the simulation to be carried out, and describes their electrical connections with one another. The signal list also specifies the currents or signals to be transferred on the stated electrical lines within the scope of the simulation, and their conduction over the electrical lines.

In a second step 32 the fault control unit 10 extracts from the signal list the information that is relevant for the local node 8. This relevant information includes in particular the electrical lines 6 as well as the fault conductor rails 12, 14, whose current flow can be influenced by the local node 8 via its switch arrangement 16. The relevant information may also include (optional or mandatory) information, on the basis of which the local node 8 can check the executability of a fault to be applied, in particular performance indicators of the fault conductor rails 12, 14, for example maximum transferable current intensities, as well as the currents to be expected on the electrical lines 6, for example maximum current intensities and maximum voltages. The information relevant for the first local node 8*a* would thus contain, for example, a description of the first electrical line 6*a*, of the first fault conductor rail 12, and of the second fault conductor rail 14. The information extracted from the signal list for a local node 8 includes all information required by the local node 8 for applying a fault, yet to be defined, to an electrical line 6. In a third step 34 the fault control unit 10 subsequently sends the extracted information to the local node 8, and the local node 8 stores the extracted information in its local memory 20.

The first step 30, the second step 32, and the third step 34 are each part of an initial configuration phase of the test stand 2. After conclusion of the configuration phase, in a fourth step 36 the fault control unit 10 starts the simulation.

During the running simulation, by means of an operational component of the test stand 2 fault descriptions may be stored in a memory that can be read out by the central fault control unit 10. The operational component may be, for example, a terminal that is installed in the test stand 2, or a personal computer (PC) that is connected to the test stand 2 and on which operating software is installed. For storing a fault description, initially a user creates a fault scenario. The fault scenario describes in a high level of abstraction an electrical fault to be simulated, and in conjunction with a virtual working environment of the test piece 4 that is simulated by the test stand 2. As an example, the test piece 4 may be an engine control unit, and the test stand 2 provides to the test piece 4, as a virtual working environment, a virtual motor vehicle that is controllable by the test piece 4. In this regard, the fault scenario may describe the electrical fault to be simulated, for example as a cable breakage of a certain electrical line to a certain spark plug of the virtual vehicle, the stated spark plug being involved in the simulation strictly as a virtual component, without being installed as a physical component in the test stand 2.

In addition to the description of the fault, a fault description also includes at least one trigger condition for applying the particular fault during the simulation. A user establishes a trigger condition in the course of storing a fault scenario. A trigger condition must be checkable by the central fault control unit 10, but apart from that may have basically any design. A trigger condition may be, for example, a simulated event in the simulation, the course of a predefined time period, or an initiation of a manual trigger by means of the operational component.

The central fault control unit 10 automatically translates the fault scenario into an abstract fault description, and stores the new fault description in the memory provided for this purpose. Unlike the fault scenario, the abstract fault description makes reference to specific, physically present electrical lines 6 of the test stand 2. To translate a fault scenario into an abstract fault description, the central fault control unit 10 accesses the signal list and information from the virtual working environment. In the above example with the spark plug, it may have been established, for example in a setup phase of the test stand 2, that the first electrical line 6*a* simulates the electrical line to the spark plug. According to the requirement, stored in the fault scenario, to simulate a cable breakage of the electrical line, a physical interruption of the first electrical line 6*a* would be described in the fault description derived therefrom.

During runtime of the simulation, in a fifth step 38 the central fault control unit 10 checks whether a new fault description is present, wherein a fault description is considered to be new if it has not yet been sent to at least one local node (seventh step 44). If this is the case, in a sixth step 42 the central fault control unit 2 assigns a name to the new fault description. The name is an arbitrary identifier via which the new fault description is clearly identifiable in the further course of the simulation.

In a seventh step 44 the fault control unit 10 creates a message containing the new fault description and its name, and sends the message as a broadcast via the bus of the test stand 2, so that each local node 8 receives a copy of the message. In this way, the fault control unit 10 transmits a first fault description in the form of the message to the first local node 8*a*, and transmits a second fault description, identical to the first fault description, to the second local node 8*b*.

In parallel with the fifth step 38, during runtime of the simulation the fault control unit 10 checks in an eighth step 40 whether a trigger condition for one of the present (i.e., not new) fault descriptions is met. As soon as a trigger condition for a fault description is met, the fault control unit 10 reads out the name of the fault description whose trigger condition is met, and in a ninth step 46 sends an execution command, which also includes the name of the fault description to be executed, as a broadcast to all local nodes via the bus of the test stand, so that both the first local node 8*a* and the second local node 8*b* receive the execution command.

Figure 3:
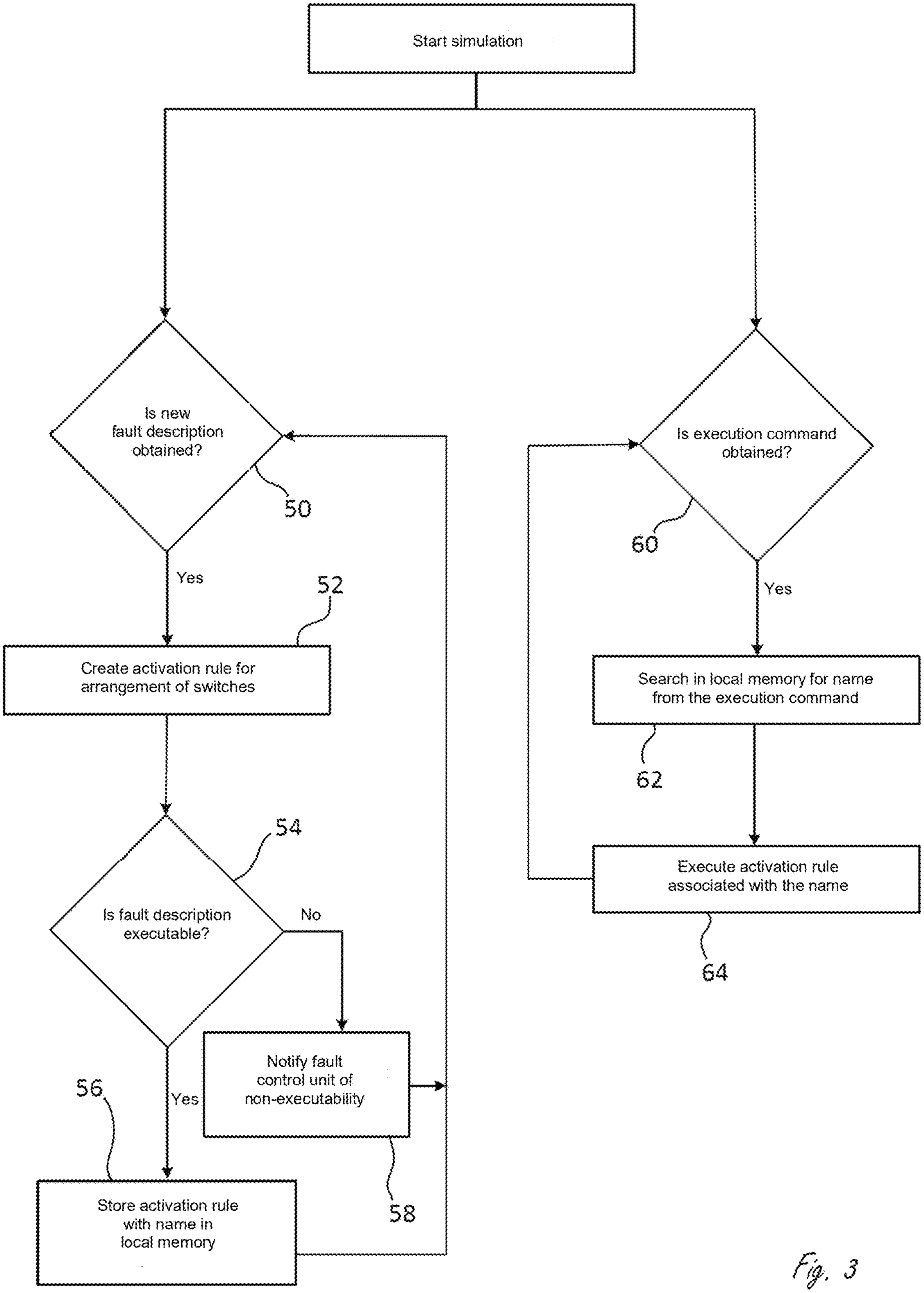
FIG. 3 shows a flow chart of the same simulation from the perspective of a local node.

The flow chart in FIG. 3 illustrates the steps carried out by a local node 8 during runtime of the simulation. The test stand 2 is configured to store each new fault description, sent in step 42, in the local memory 20 of the particular local node 8 that receives the new fault description. In a tenth step 50 the local node 8 carries out a cyclical check for whether a new fault description is stored in the local memory 20, wherein a fault description is considered to be new if no process for creating an activation rule (eleventh step 52) has yet been started for the fault description.

If this is the case, in an eleventh step 52 the local node starts a routine, stored on the local processor unit 18, for creating an activation rule for the switch arrangement 16 of the local node. The routine evaluates the requirements stored in the fault description, and initially checks whether the particular local node 8 is involved at all in applying the electrical fault described in the fault description. If this is not the case, the local node 8 ignores the fault description; i.e., it stops the processing of the fault description and deletes it from its local memory 8. In the normal case, a local node is involved with applying a fault when its fault description includes an electrical line 8 of the test stand 2 to which the particular local node 8 is connected. For example, if the first local node 8*a* were to find a fault description in the first local memory 20*a* that described a fault to be applied to the second electrical line 8*b*, the first local node would ignore this fault description, since no switch from the first arrangement of switches 16*a* is connected to the second electrical line 6*b*.

During the check, if the local node 8 comes to the conclusion that it is involved with applying the fault, the local node 8, taking into account the information stored on its own local memory 20, creates an activation rule for its own switch arrangement 16 for applying the fault, specified in the fault description, to the electrical line 6 specified in the fault description.

In a twelfth step 54 the local node 8 checks whether the fault description is executable, wherein the local node 8 evaluates the fault description as executable only if an activation rule that meets the specifications of the fault description has been successfully derived in the eleventh step 52. If the activation rule is present, in a thirteenth step 56 the local node 8 stores the activation rule, together with the name stored in the fault description, in the local memory 20. If no activation rule is present, due to the fact that the routine stored on the local processor unit 18 has evaluated the specifications of the fault description as not fulfillable, in a fourteenth step 58 the local node 8 creates a message concerning the non-executability of the fault description, and sends the message to the central fault control unit 10.

In parallel with the check for new fault descriptions (tenth step 50), in a fifteenth step 60 the local node 8 carries out a cyclical check for whether a new execution command from the fault control unit 10 is present. If a new execution command is present, the local node 8 reads out the name stored in the new execution command, searches its local memory 20 for the name, and if it finds therein an activation rule associated with the name, executes the activation rule associated with the name in order to apply the electrical fault associated with the name to the electrical line 6. If the local node 8 finds no activation rule associated with the name, the local node 8 ignores the execution command.

Figure 4:
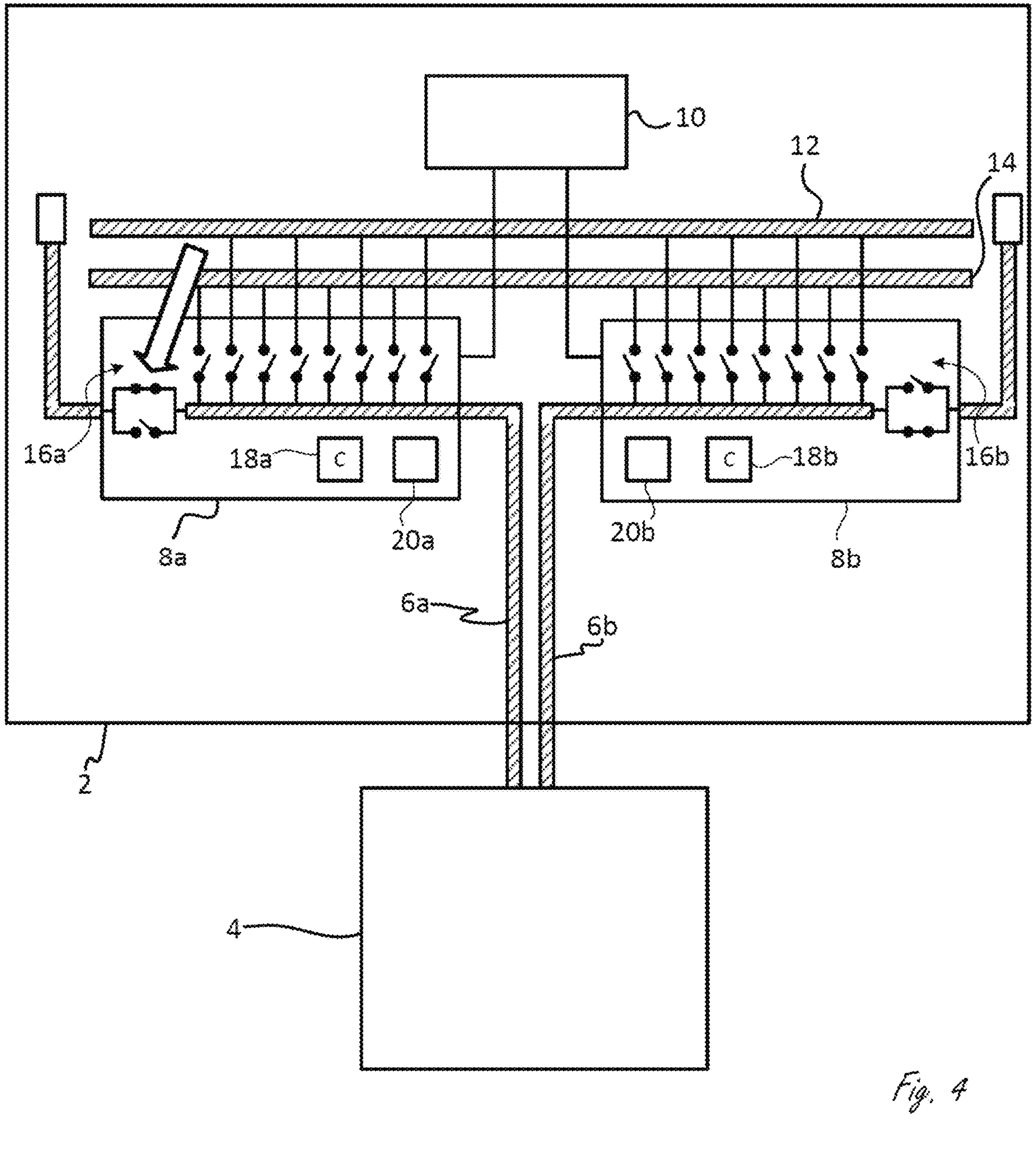
FIG. 4 shows a first switching example for simulating an electrical fault.
Figure 5:
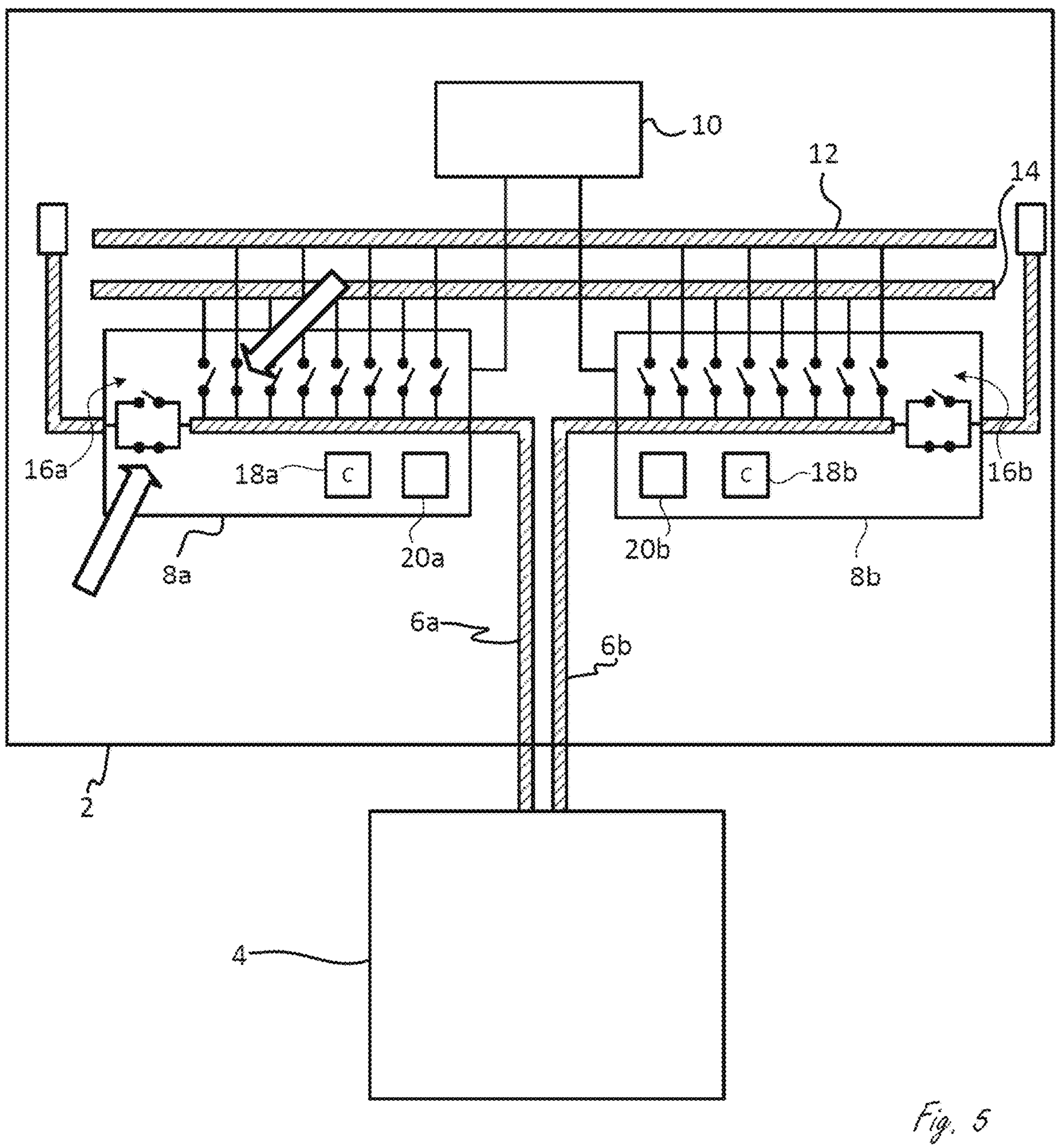
FIG. 5 shows a second switching example for simulating an electrical fault.
Figure 6:
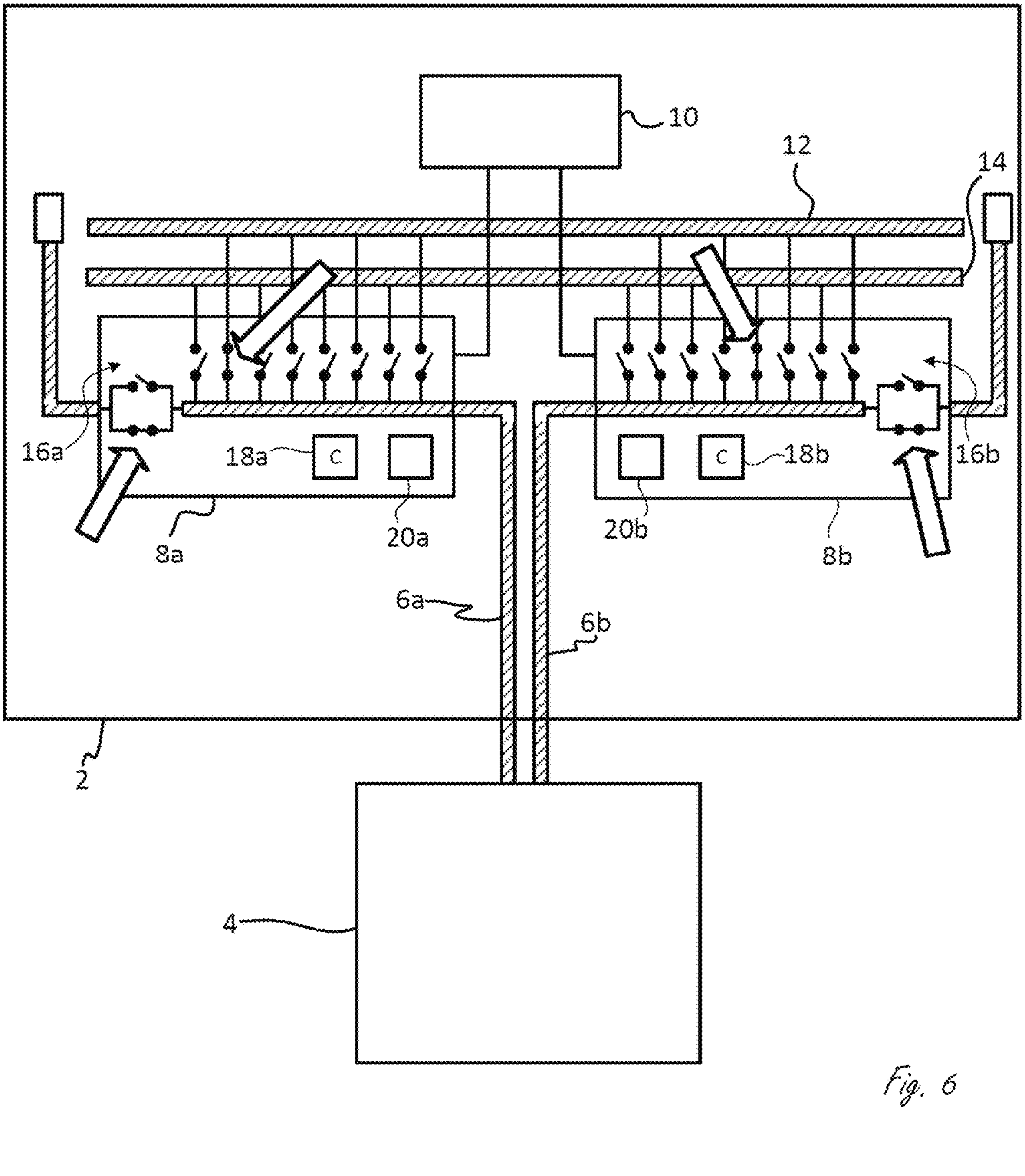
FIG. 6 shows a third switching example for simulating an electrical fault.

The illustrations in FIGS. 4 through 6 show the test stand 2 with examples of changed switch configurations for applying different electrical faults.

Example 1: Loose Contact

The illustration in FIG. 4 shows a switch configuration in a first example of an applied fault. In this first example, in the fifth step 38 the fault control unit 10 finds a fault description that describes a loose contact on the first electrical line 6*a*. The fault description specifies the loose contact as a bounce pattern of successive time intervals having randomly varying lengths, in which contact and no contact are present in alternation, and whose average length is five seconds with a spread of 4.5 seconds.

In the sixth step 42, the fault control unit 10 gives the new fault description the name "fault 1," and under this name sends the new fault description to the local nodes 8.

During the evaluation of the new fault description, the first local node 8*a* establishes in the twelfth step 52 that the first switch arrangement 16*a* includes a controllable semiconductor switch (see arrow) that is suitable for applying the fault pattern "loose contact," and across which it can lead the current conducted by the first electrical line 6*a*. The first local node 8*a* compares the specifications of the expected current on the first electrical line 6*a* to the performance indicators of the identified semiconductor switch, and determines that the semiconductor switch can conduct the expected current intensity without damaging the semiconductor switch, and that the expected voltage at the first electrical line 6*a* is less than the breakdown voltage of the semiconductor switch.

The first local node 8*a* accordingly creates a new activation rule with instructions for activating the first switch arrangement 16*a*. The instructions may be read out and interpreted by an activation routine that is stored on the local processor unit 18*a*. The new activation rule includes the instructions to open or switch to the nonconductive state all switches from the first switch arrangement 16 with the exception of the identified semiconductor switch, to load a bounce pattern simulation routine, stored on the first local memory 20*a*, into the first local processor unit 18*a* and configure it according to the specifications from the fault description, and by starting the bounce pattern simulation routine, to switch the semiconductor switch to the conductive state and nonconductive state in alternation, according to the predefined bounce pattern.

The first local node 8*a* assesses the fault description as executable (twelfth step 54), sends a corresponding confirmation signal to the central fault control unit 10, and stores the activation rule under the name "fault 1" on the first local memory 20.

In the subsequent course of the simulation, as soon as a trigger condition for "fault 1" is met the fault control unit 10 sends an execution command "execute fault 1" to the local node 8 (eighth step 40 and ninth step 46). The execution command prompts the first local node 8*a* to load the activation rule, stored under the name "fault 1," from the first local memory 20*a* and to execute the activation rule using the activation routine.

Only the differences from Example 1 are explained in the following examples. A detailed description of operations that run the same way as in Example 1 is dispensed with.

Example 2: Leakage Current to Ground

The illustration in FIG. 5 shows a switch configuration in a second example of an applied fault. In this example, the fault control unit 10 finds a fault scenario that describes diversion of a fraction of the current, flowing on the first electrical line 6*a*, to ground (a vehicle body, for example) as the result of an undesired electrical contact (due to cable sheath abrasion, for example). The electrical resistance of the undesired electrical contact is specified at 5Ω.

The fault control unit 10 translates this scenario into a fault description that specifies an electrical connection of the first electrical line 6*a* on the first fault conductor rail 12, names the fault description "fault 2," and sends the fault description to the local nodes 8. The first local node 8*a* establishes that the first switch arrangement 16*a* includes a suitable controllable semiconductor switch, on the basis of which the first electrical line 6*a* is connectable to the first fault conductor rail 12 with the desired resistance.

The first local node 8*a* creates a new activation rule. The new activation rule contains the specifications to set the stated semiconductor switch to 5Ω, to conduct the main current flow of the first electrical line 6*a*, free of resistance, across a closed mechanical switch, and to open or switch to the nonconductive state all other switches from the first switch arrangement 16*a*. The first local node 8*a* stores the new activation rule in the first local memory 20*a* under the name "fault 2," and waits for an execution command "execute fault 2" for executing the new activation rule.

Example 3: Leakage Current Between Two Electrical Lines

The illustration in FIG. 6 shows a switch configuration in a third example of an applied fault. In this example, the fault scenario describes a macro fault, namely, an undesired electrical connection between the first electrical line 6*a* and the second electrical line 6*b*. The electrical resistance of the undesired electrical connection is specified at 5 ω. The fault control unit 10 creates a corresponding fault description, names it "fault 3," and sends it under this name to the local nodes 8.

In the analysis of the fault description, the first local node 8*a* recognizes that it is involved in applying the fault "fault 3" because the fault description includes specifications for the first electrical line 6*a*. Based on a predefined convention that is known to the routine for creating an activation rule, the first local node 8*a* also recognizes that it is responsible for applying the resistance specified in the fault description. The first local node then creates an activation rule to allow the electrical current to flow on the first electrical line 6*a* without additional resistance, and also to establish an electrical connection between the first electrical line 6*a* and the first fault conductor rail 12, and stores the activation rule in the first local memory 20*a* rule under the name "fault 3."

In the analysis of the fault description, the second local node 8*b* recognizes that it is involved in applying the fault "fault 3" because the fault description includes specifications for the second electrical line 6*b*. Based on the predefined convention, the second local node 8*b* also recognizes that it is not responsible for applying the resistance specified in the fault description. The second local node then creates an activation rule to allow the electrical current to flow on the first electrical line 6*a* without additional resistance, and also to establish a resistance-free electrical connection between the second electrical line 6*b* and the first fault conductor rail 12, and stores the activation rule in the second local memory 20*b* under the name "fault 3." As soon as a trigger condition associated with the "fault 3" is met, the fault control unit 10 sends an execution command "execute fault 3" to the local nodes 8. The first local node 8*a* then executes the activation rule that is stored in the first local memory 20*a* under the name "fault 3," and the second local node 8*b* executes the activation rule that is stored in the second local memory 20*b* under the same name. According to the specification of the fault scenario, this results in an electrical connection of the first electrical line 6*a* to the second electrical line 6*b*, conducted via the first conductor rail 12, with an electrical resistance of 5Ω.

The invention claimed is:

1. A test stand that is configured to confront a test piece with a simulated electrical fault, including a central fault control unit for orchestrating the simulated electrical faults; and including at least one first local node that is configured to carry out a fault simulation prompted by the fault control unit by activating a first switch arrangement for falsifying selected electrical currents in the test stand;

characterized in that the fault control unit is configured to create a first abstract fault description that specifies at least one first electrical fault to be applied to a first electrical line, and to transmit it to the first local node; and the first local node is configured to derive from the first abstract fault description a first activation rule for the first switch arrangement that is suitable for applying the first electrical fault to the first electrical line and to apply the first electrical fault to the first electrical line by activating the first switch arrangement according to the first activation rule.

2. The test stand according to claim 1, the first local node of which is designed as a modular part, in particular as a plug-in circuit board.

3. The test stand according to claim 1, the fault control unit of which, for orchestrating the electrical faults, is configured to read out a cabling description in which at least the first electrical line is listed, and which is stored on the test stand.

4. The test stand according to claim 1, the fault control unit of which is configured to specify the first electrical fault in the first abstract fault description as a cable breakage, a short circuit, a leakage current to ground, a leakage current between the first electrical line and a second electrical line, a loose contact, or a bounce pattern.

5. The test stand according to claim 1, the first electrical line of which is configured to conduct an electrical current that transfers energy and/or information from the test piece to the test stand, or that transfers the energy and/or information from the test stand to the test piece.

6. The test stand according to claim 1, including an arrangement of fault conductor rails, wherein the first local node is configured to establish an electrical contact of the first electrical line with a fault conductor rail by activating the first switch arrangement.

7. The test stand according to claim 6, whose arrangement of fault conductor rails includes fault conductor rails extending in parallel with different electrical properties, in particular one fault conductor rail being optimized for conducting high current intensities, and one fault conductor rail being optimized for conducting electrical signals for information transfer.

8. The test stand according to claim 1, the first local node of which is configured to check the first fault description for executability, and to provide feedback of non-executability of the first fault description to the fault control unit, wherein the check for executability includes in particular at least one of the following checks:

a comparison of a switching time of at least one switch from the first switch arrangement to a time setting contained in the first fault description;

a comparison of a current-carrying capacity of at least one switch from the first switch arrangement to a current intensity specification contained in the first fault description;

a comparison of a breakdown voltage of at least one switch from the first switch arrangement to a voltage specification contained in the first fault description.

9. The test stand according to claim 1, whose arrangements of switches as a whole includes mechanical switches and semiconductor switches, in each case activated by a local node.

10. The test stand according to claim 1, the first local node of which is configured to determine a first time period required for applying the first electrical fault, and to transmit the first time period to the fault control unit; and the fault control unit of which is configured to take the first time period into account in the orchestration.

11. The test stand according to claim 10, including a second local node that is configured to carry out a fault simulation prompted by the fault control unit by activating a second switch arrangement for falsifying selected electrical currents in the test stand;

the fault control unit of which is configured to create a second abstract fault description that specifies at least a second electrical fault that is to be applied to the second electrical line, and to transmit it to the second local node;

wherein the second local node is configured, based on the second abstract fault description, to derive a second activation rule for the second switch arrangement that is suitable for applying the second electrical fault to the second electrical line, to determine a second time period that is required for applying the second electrical fault, and to transmit the second time period to the fault control unit, and to apply the second electrical fault to the second electrical line by activating the second switch arrangement according to the second activation rule;

wherein the fault control unit is configured to synchronize the application of the first electrical fault with the application of the second electrical fault, taking the first time period and the second time period into account.

* * * * *